United States Patent
Ben-Tzur

(10) Patent No.: US 8,516,421 B1
(45) Date of Patent: Aug. 20, 2013

(54) GENERATING CIRCUIT DESIGN PROPERTIES FROM SIGNAL TRACES

(75) Inventor: Asa Ben-Tzur, Shekhanya (IL)

(73) Assignee: Jasper Design Automation, Inc., Mountain View, CA (US)

( * ) Notice: Subject to any disclaimer, the term of this patent is extended or adjusted under 35 U.S.C. 154(b) by 0 days.

(21) Appl. No.: 13/347,114

(22) Filed: Jan. 10, 2012

(51) Int. Cl.
*G06F 17/50* (2006.01)

(52) U.S. Cl.
USPC ........... 716/108; 716/106; 716/113; 716/136; 703/14

(58) Field of Classification Search
USPC ................... 716/106, 108, 113, 136; 703/14
See application file for complete search history.

(56) References Cited

U.S. PATENT DOCUMENTS

| | | | | |
|---|---|---|---|---|
| 6,618,841 | B1 * | 9/2003 | Huang | 716/103 |
| 7,243,322 | B1 * | 7/2007 | Ly et al. | 716/108 |
| 7,325,209 | B2 * | 1/2008 | Mitra et al. | 716/102 |
| 7,421,668 | B1 * | 9/2008 | Ip et al. | 716/108 |
| 7,725,851 | B2 * | 5/2010 | Eisner et al. | 716/106 |
| 7,908,532 | B2 * | 3/2011 | Eckelman et al. | 714/726 |
| 7,926,020 | B1 | 4/2011 | Lu et al. | |
| 7,958,475 | B2 * | 6/2011 | Khan | 716/109 |
| 7,984,401 | B2 * | 7/2011 | Lehavot et al. | 716/106 |
| 8,024,691 | B2 * | 9/2011 | Zilic et al. | 716/132 |
| 8,326,778 | B1 * | 12/2012 | Lu et al. | 706/12 |
| 2001/0016933 | A1 * | 8/2001 | Chang et al. | 716/1 |
| 2002/0138812 | A1 | 9/2002 | Johannsen | |
| 2004/0236560 | A1 * | 11/2004 | Chen | 703/18 |
| 2005/0209840 | A1 * | 9/2005 | Baklashov et al. | 703/22 |
| 2006/0156145 | A1 * | 7/2006 | Mitra et al. | 714/742 |
| 2007/0294651 | A1 | 12/2007 | Tsai et al. | |
| 2007/0299648 | A1 * | 12/2007 | Levitt et al. | 703/22 |
| 2008/0082946 | A1 * | 4/2008 | Zilic et al. | 716/5 |
| 2008/0184180 | A1 | 7/2008 | Takenaka et al. | |
| 2010/0088257 | A1 | 4/2010 | Lu et al. | |

OTHER PUBLICATIONS

NextOp Software, Inc., "Assertion Synthesis," May 16, 2010, three pages. [Online] [Retrieved Nov. 1, 2011] Retrieved from the Internet <URL:http://web.archive.org/web/20100516025551/http://www.nextopsoftware.com/BugScope-assertion-synthesis.html.>.
U.S. Appl. No. 13/455,926, filed Apr. 25, 2012, Inventors Asa BenTzur et al., [Copy Not Enclosed].
U.S. Appl. No. 13/231,583, filed Sep. 13, 2011, Inventors Claudionor Jose Nunes Coelho Jr. et al., [Copy Not Enclosed].
United States Office Action, U.S. Appl. No. 13/231,583, Jul. 23, 2012, 11 pages.

* cited by examiner

*Primary Examiner* — Naum Levin
(74) *Attorney, Agent, or Firm* — Fenwick & West LLP

(57) ABSTRACT

A property generation tool that automatically generates a property for a circuit design from a signal trace of the circuit design. The property generation tool receives a trace of a circuit design. The trace includes signal values for a number of signals of the circuit design over a number of clock cycles. Signal signatures are generated from one or more characteristics of the signal values. Sets of candidate signals are identified from the circuit design signals based on the signal signatures. One or more properties of the circuit design are generated based on the signal values associated with the sets of candidate signals. The property can be output, for example, for display to a user of the property generation tool. Examples of properties that are generated by the property generation tool include handshaking properties and fairness properties.

20 Claims, 6 Drawing Sheets

GENERATING CIRCUIT DESIGN PROPERTIES FROM SIGNAL TRACES

BACKGROUND

1. Technical Field

This invention relates generally to analysis of circuit designs, and more particularly to generating properties for circuit designs from signal traces.

2. Description of the Related Art

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation, and formal verification. RTL describes the registers of a computer or digital electronic system and the way in which data are transferred among the combinational logic between registers.

During some of these verification techniques, a circuit design may be tested against a set of properties to evaluate the operation of the circuit design. Properties are statements or expressions about some expected behavior of the circuit design. Some properties can be shown to be true or false during verification testing. The conventional method for creating properties requires the circuit designer to examine the circuit design and to manually code the properties based on the circuit designer's own knowledge of the circuit design. However, manually creating properties is tedious and prone to errors. Furthermore, as the circuit design changes, the properties must be checked for consistency and re-written to comply with the design changes. Accordingly, what are needed are techniques to expedite the process of generating properties and to reduce the overall time needed for verifying a circuit design.

SUMMARY

A property generation tool automatically generates a property for a circuit design from a trace of the circuit design. In one embodiment, the property generation tool receives a trace of a circuit design. The trace includes signal values for a number of signals of the circuit design over a number of clock cycles. Signal signatures are generated from the signal values, and each signal signature is generated for a different signal of the circuit design. For a given signal, a signal signature can represent a concise summary of one or more characteristics of the signal's values.

The property generation tool generates one or more properties of the circuit design based on the signal signatures. In one embodiment, the tool generates a property by applying candidate detection rules to the signal signatures to identify sets of candidate signals for further analysis. Property detection rules are applied to the signal values associated with the candidate signal sets to identify at least one set of candidate signals that satisfy the property detection rules. One or more properties are generated for the sets of candidate signals that satisfy the property detection rules. The one or more properties are then output, for example, to a computer memory or for display to a user of the property generation tool.

Using signal signatures to generate a property reduces the amount of time needed to generate the property. As a large number of signals can be present in a trace of the circuit design, analyzing every one of these signals in detail when generating a property can consume a significant amount of processing power. The signal signatures allow for quick identification of candidate signals that are candidates for more detailed analysis, effectively pruning down the number of signals that are be analyzed with the property detection rules. The property detection rules are then applied only to the signal values for the candidate signals instead of all the signal values in the signal trace.

In one embodiment, the property generated by the property generation tool includes a handshake property. A handshake property describes a handshaking protocol (e.g. acknowledge and request protocol) for the signals of the circuit design. In another embodiment the property generated by the property generation tool includes a fairness property. A fairness property describes arbitration between different requestors to a shared resource (e.g. a shared bus) of the circuit design. In other embodiments, other types of properties can also be generated by the property generation tool.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Tool Flow for Property Generation

Figure 1:
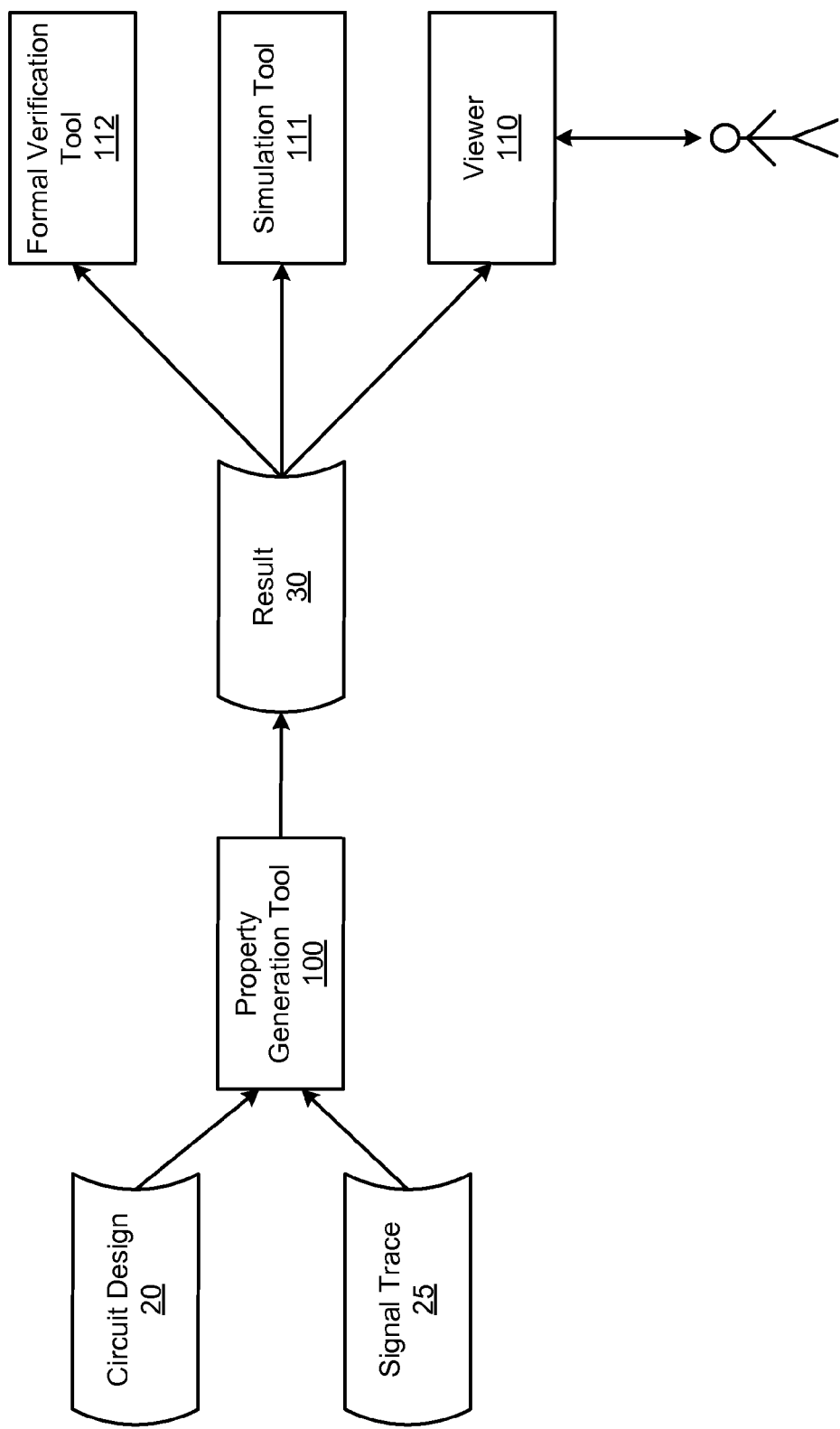
FIG. 1 is a diagram of property generation in accordance with an embodiment.

FIG. 1 illustrates a diagram of property generation for a circuit design 20, according to an embodiment. The description of the circuit design 20 describes the structural design and operation of a circuit. The description of the circuit design 20 may be embodied as register transfer level (RTL) source code encoded using a hardware description language (HDL) such as Verilog HDL or VHDL. In other embodiments, the description of the circuit design 20 may be embodied as a gate level netlist. The signal trace 25 includes signal values for signals in the circuit design 20 over a number of clock cycles. The trace 25 may have been generated during a simulation of the circuit design 20. The trace 25 may be stored to disk and retrieved by the analysis tool 100 or passed along directly from a process that generated the trace 25.

A property generation tool 100 receives the circuit design 20 and signal trace 25 as inputs and generates a result 30. The result 30 includes one or more properties that are obtained by analyzing the circuit design 20 in conjunction with the signal trace 25 and inferring the properties from the signal values in the signal trace 25. The properties describe some behavior of the circuit design, such as the relationship between two or more signals in the circuit design. The properties may be assertions, where the assertion is satisfied if the property is true for all operating conditions of the circuit design 20. A plain language example of an assertion is "if A is 1, B must be 1 in the next clock cycle." The properties may also include covers, where the cover is satisfied if the property is true for some operating condition of the circuit design 20. An plain language example of an cover is "if A is 1, B could be 1 in the next clock cycle." The properties may also include assumptions, where an assumption rules out some operating condition of the circuit design 20. A plain language example of an assumption is "assume that if A is 1, B must be one in the next clock cycle".

In one embodiment, the properties include handshake properties that describe a handshake protocol. During handshaking, a receiving circuit receives a communication request (e.g., a REQ signal) from a requesting circuit and responds to the request by sending an acknowledgement (e.g., an ACK signal) back to the requesting circuit. A handshake protocol refers to one or more rules that are followed by the request and acknowledge signals during handshaking A handshake property may describe the handshake protocol using parameters such as the minimum number of clock cycles before a request is acknowledged, the maximum number of clock cycles before a request is acknowledged, as well as other types of parameters that are relevant for a handshake protocol. Other examples of parameters can be found in the assert_handshake property defined by the Open Verilog Library (OVL).

In one embodiment, the properties include fairness properties. Circuit designs often include multiple circuits that have access to a shared resource, such as a shared communication bus. Access to the bus is controlled by an arbitration circuit that allocates access fairly among the requesting circuits. Fairness properties describe shared resource arbitration among multiple requestors to ensure that no requestor is starved of access to the shared resource. For example, suppose one requestor requests access to a shared bus via the req0 signal and receives an acknowledgement of that request via the ack0 signal. Another requestor requests access to the shared bus via the req 1 signal and receives an acknowledgement of that request via the req 1 signal. A fairness property of assert fairness (req0, req1, ack [1:0]) may check for the following conditions: if req<i> and req<j> are both pending (for any i !=j pair), then req<i> shall not be acknowledged twice before acknowledging req<j>.

One of the challenges in generating properties from signal traces is processing the immense amount of data that is available in the signal traces. Each signal trace may include millions of signals spanning millions of clock cycles. However, comparing the signal values between all of these different signals in order to generate properties requires a tremendous amount of processing power. In one embodiment, the property generation tool 100 reduces the amount of time needed to generate properties by pruning down the number of signals that need to be analyzed in detail prior to applying a set of computationally intensive property detection rules that are designed to detect properties.

In one embodiment, to prune the signal trace, the property generation tool first identifies a point of interest (POI) in the description of the circuit design. A POI is a set of signals that are related to each other and may represent some feature in the circuit design (e.g. First In First Out (FIFO), finite state machine (FSM), etc). The POI itself may still include a large number of signals (e.g. 1000 signals). To further reduce the number of signals, the property generation tool generates signal signatures for each signal in the POI. Each signal signature represents the signal values of a single signal in the trace and includes information that succinctly summarizes the characteristics of the signal values. For example, a million clock cycles of signal values can be summarized in a signal signature with a single number that represents the number of cycles in which the signal values are logic low. Using the signal signatures, a smaller set of signals from the trace can be identified that are candidates for further analysis. The more time consuming process of applying the property detection rules are then performed only on the candidate signals.

In one embodiment, the result 30 of the formal verification process may be formatted into a report and presented in a viewer 110 to a circuit designer to facilitate the designer's understanding of the circuit design 20. The circuit designer may then modify the properties or choose which properties to use when performing verification tests. In another embodiment, the result 30 may be passed along to a simulation tool 111 that simulates the circuit design 20 over a number of additional clock cycles. This additional simulation data can also be processed by the property generation tool 100 to refine the results 30 of the property generation tool 30. In yet another embodiment, the result 30 may be passed along to a formal verification tool 112. The formal verification tool 112 uses mathematical techniques to prove that assertion properties are either always true or provide an example condition (called a counterexample) that demonstrates the property is false. Tools that use formal methods to verify RTL source code and design properties are known as "model checkers." Formal verification tools 112 are typically more exhaustive than simulation based testing and can exercise states of the circuit design that are missed by simulation.

Example and Method of Property Generation

Figure 2:
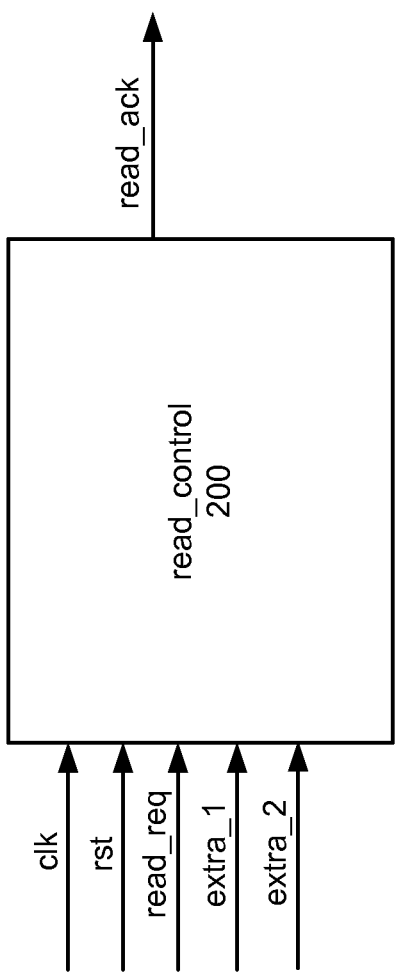
FIG. 2 is a block diagram of a portion of a circuit design, according to an embodiment.

FIG. 2 is a block diagram of a portion 200 of a circuit design, according to an embodiment. For ease of explanation, the operation of the property generation tool 100 will be described by using the circuit of FIG. 2 as an example. In other embodiments, the principles described herein may be applied to other portions of a circuit design that have a different number of inputs or outputs or have different functionality.

As shown, clk, rst, read_req, extra_1 and extra_2 are the input signals to a read_control module 200. Read_ack is the output signal from the module 200. The module 200 also includes a 3 bit read_delay register (not shown) that maintains information used for controlling the operation of the module 200. In some embodiments, the read_control module 200 may represent an arbitration circuit that controls access to a shared resource, such as a communication bus. Signal read_req thus represents a request to access a shared resource and read_ack represents an acknowledgement of that request. In RTL, the code that defines the basic structure of the circuit 200 may read:

01 module read_control (clk, rst, read_req, read_ack, extra_1, extra_2);
02 input clk;
03 input rst;
04 input read_req;
05 output reg read_ack;
06 reg [2:0] read_delay;
07 input extra_1
08 input extra_2

In the RTL, part of the code that defines the functions of the circuit 200 may read:
17 always @(posedge clk or negedge rst) begin
18 if (~rst) begin

```
19 read_delay <=0;
20 read_ack <=0;
21 end
22 else if (read_delay!=0) begin
23 read_delay<=read_delay—3'b001;
24 read_ack<=0;
25 end
26 else if (read_req) begin
27 read_delay <=3'b111;
28 read_ack <=1;
29 end
30 end
```

Line 17 indicates that the module 200 is positive edge-triggered. Lines 18-21 indicate that if rst is logic low, the read_delay register is cleared out and the read_ack signal is set to logic low, thereby resetting the state of the module 200. Lines 22-25 indicate that if read_delay is not zero, read_delay is decremented by one and read_ack is set to logic low. Lines 26-29 indicate that if read_req is logic high, the read_delay register is set to "111" and read_ack is set to logic high. The function of the extra_1 signal and extra_2 signals are not shown in this portion of the code. The functionality of these signals is not defined in this portion of the code as the precise function of these signal is not needed for explaining the disclosed embodiments.

Figure 3A:
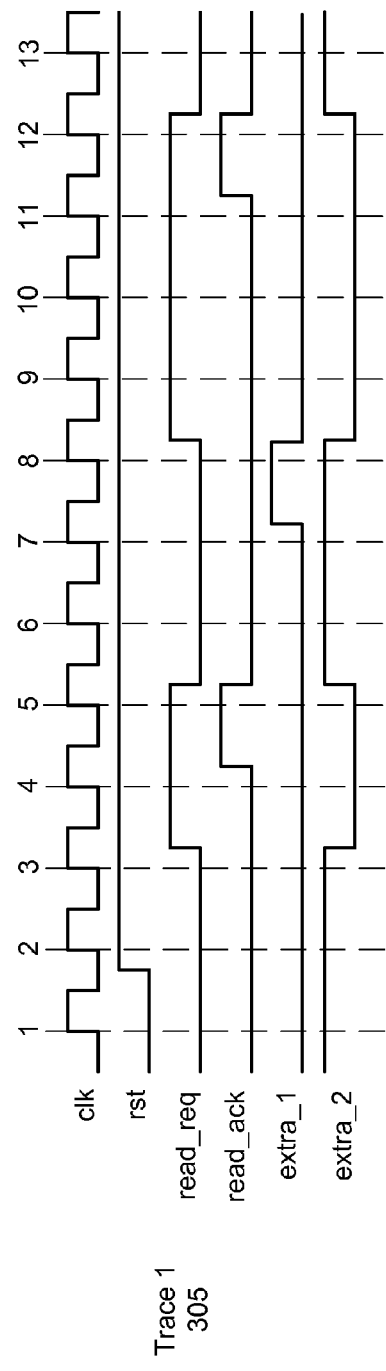
FIG. 3A is a signal trace for the portion of the circuit design of FIG. 2, in accordance with an embodiment.
Figure 3B:
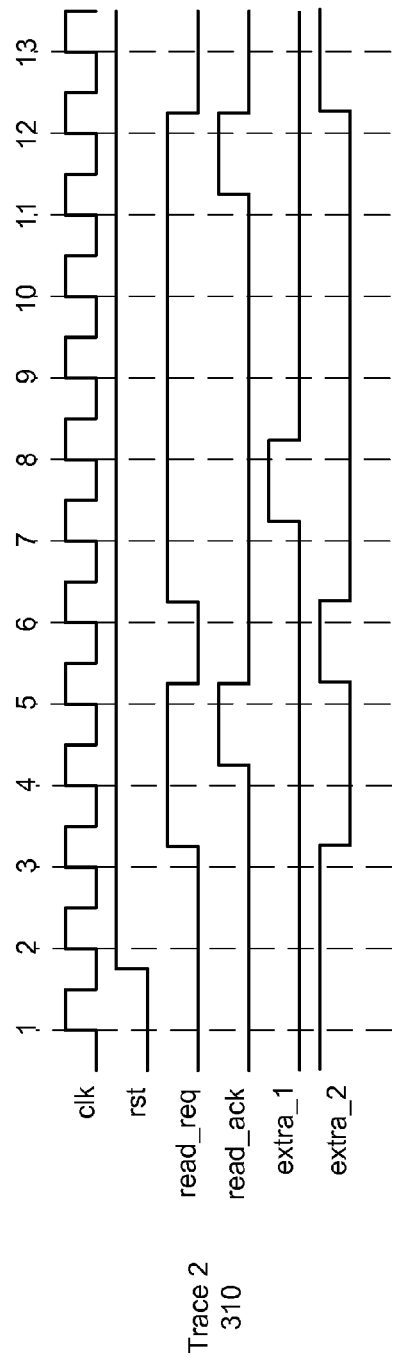
FIG. 3B is another signal trace for the portion of the circuit design of FIG. 3, in accordance with an embodiment.

FIGS. 3A and 3B are waveforms of two different traces for the input and output signals of the module 200 of FIG. 2, according to an embodiment. Both trace 305 and 310 show that that whenever read_req is asserted, read_ack is asserted at a later clock cycle as an acknowledgement of that request. Read_req stays asserted until read_ack is asserted, and read_ack can only be asserted once every eight clock cycles. The extra_1 signal is asserted during cycle 8 only. The extra_2 signal is an inverted version of the read_req signal. Only six signals are shown in these two traces 305 and 310, but in other embodiments the traces may have signal values for a large number (e.g., millions) of signals spanning a large number (e.g., millions) of clock cycles.

Figure 4A:
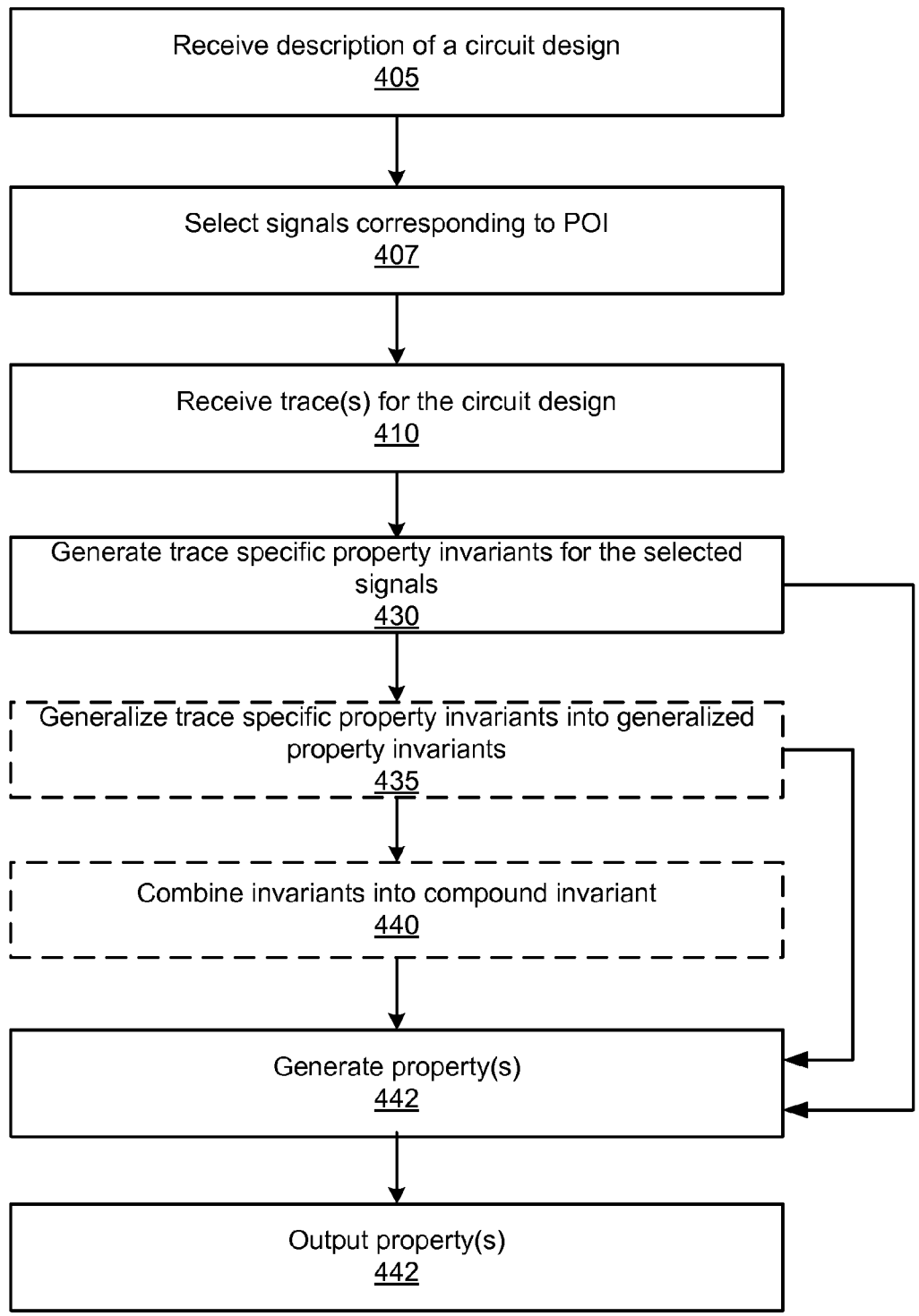
FIG. 4A is a flowchart of a method performed by a property generation tool, in accordance with an embodiment.

FIG. 4A is a flowchart of a method for generating circuit design properties performed by a property generation tool 100, in accordance with an embodiment. FIGS. 4A-4D will be explained in conjunction with FIGS. 2, 3A and 3B.

In step 405, the property generation tool receives a description of a circuit design. For example, the description of the circuit design may include the RTL code for the read_control module 200 and RTL code for other portions of the circuit design. The description of the circuit design may include a large number of signals, some of which will be selected for further analysis in order to generate properties.

In step 407, the property generation tool selects a point of interest (POI) in the circuit design and a set of signals that correspond to the POI. As previously described, a POI is a set of signals that are related to each other and may represent some feature in the circuit design. For example, a POI may be a synchronous portion of the circuit design that accepts a clock signal as an input and uses the clock signal as a timing reference. The POI may be selected according to a user input that explicitly identifies a portion of the circuit design as the POI. For example, a user may explicitly flag the read_control module 200 as a POI, and the tool extracts the module 200 interface (e.g., read_req, read_ack, extra_1, extra_2) as the signals for that POI. Alternatively, the tool may apply a set of heuristic rules to identify a POI. For example, the property generation tool may search for any portions of the description of the circuit design 20 that implement FSM functionality and identify those portions of circuit design 20 as POIs. Other examples of rules that can be used to identify a POI are described in commonly owned U.S. application Ser. No. 13/231,583, filed on Sep. 13, 2011 and titled "Generating Properties for Circuit Designs," which is incorporated by reference herein in its entirety.

In step 410, the property generation tool receives one or more signal traces that include information about the signals of the circuit design, such as signal values for the circuit design signals over a number of clock cycles. For example, the signal traces may include information that can be used to generate the visual waveforms shown in FIGS. 3A and 3B.

In step 430, the property generation tool generates trace specific property invariants for the selected signals 430. A property invariant can be viewed as a logic relation between signals that holds true throughout the trace and may be used in later steps to generate a property for the circuit design. In one embodiment, an invariant associates a particular type of property (e.g., handshake, fairness), the signals of the circuit design that are relevant to the property type, and any parameters that describe some attribute or limitation of the property type. As there may be multiple signal traces, each trace is analyzed individually to generate a set of one or more property invariants that are specific to that trace. The result of step 430 is multiple sets of trace specific property invariants, each set being associated with a single signal trace. Continuing with the example from FIGS. 3A and 3B, a handshake property invariant may be generated for the signal trace 305 from FIG. 3A, and another handshake property invariant may be generated for the signal trace 310 from FIG. 3B.

In step 435, the property generation tool 100 generalizes the trace specific property invariants across different signal traces to create generalized property invariants. A generalized property invariant is an abstracted version of the trace specific property invariants that represents a behavior of the circuit design across all traces. A generalized property invariant is also a more accurate representation of the behavior of the circuit design than the individualized property invariants because it holds true across multiple signal traces. Continuing with the example from FIGS. 3A and 3B, the trace specific property invariants may include trace specific handshake properties for FIGS. 3A and 3B, and the generalized property invariant generated in step 435 is an abstracted version of the two trace specific handshake property invariants.

In step 440, the property generation tool combines the generalized invariants into compound property invariants. A compound property invariant represents the combination of different generalized property invariants to describe a behavior of the circuit design that is different than that represented by the generalized property invariants. For example, the generalized property invariants may include handshake property invariants and a one-hot property invariant. A one-hot property may specify that for a group of signals, the only legal combination of values are those where a single signal is high and all others are low. The property generation tool combines the handshake property invariants and one-hot property invariant to create a fairness property invariant. In one embodiment, the compound property invariants may be composed from the trace specific property invariants instead of the generalized property invariants.

In step 442, the property generation tool generates one or more properties of the circuit design from the property invariants. The properties may be generated from either the trace specific property invariants identified in step 430, the generalized property invariants identified in step 435, or the composed property invariants identified in step 440. In one embodiment, the properties are generated as assertion properties, assumption properties, or cover properties.

In step 444, the property generation tool outputs the one or more properties. The properties may be stored to a computer memory for later use during verification, presented/displayed to the user, and/or passed along to a verification tool (e.g., simulation tool or formal verification tool) that verifies the circuit design against the properties. If presented to the user, the properties may be output as assertion properties, assumption properties, or cover properties. All three representations may be presented to a user of the property generation tool. The user can then select one of the three representations of the property or make changes to the properties before verifying the circuit design against the property. If passed to a formal verification tool, the circuit design is then formally verified against the properties to prove if the properties hold true using formal mathematical techniques.

In one embodiment, the properties may be output to a translation tool. The translation tool then translates the properties into a specific assertion based language, such as the Property Specification Language (PSL) or the SystemVerilog Assertion (SVA) language. In other embodiments, the properties output by the property generation tool may already be formatted in a specific assertion language.

Trace Specific Property Invariants

Figure 4B:
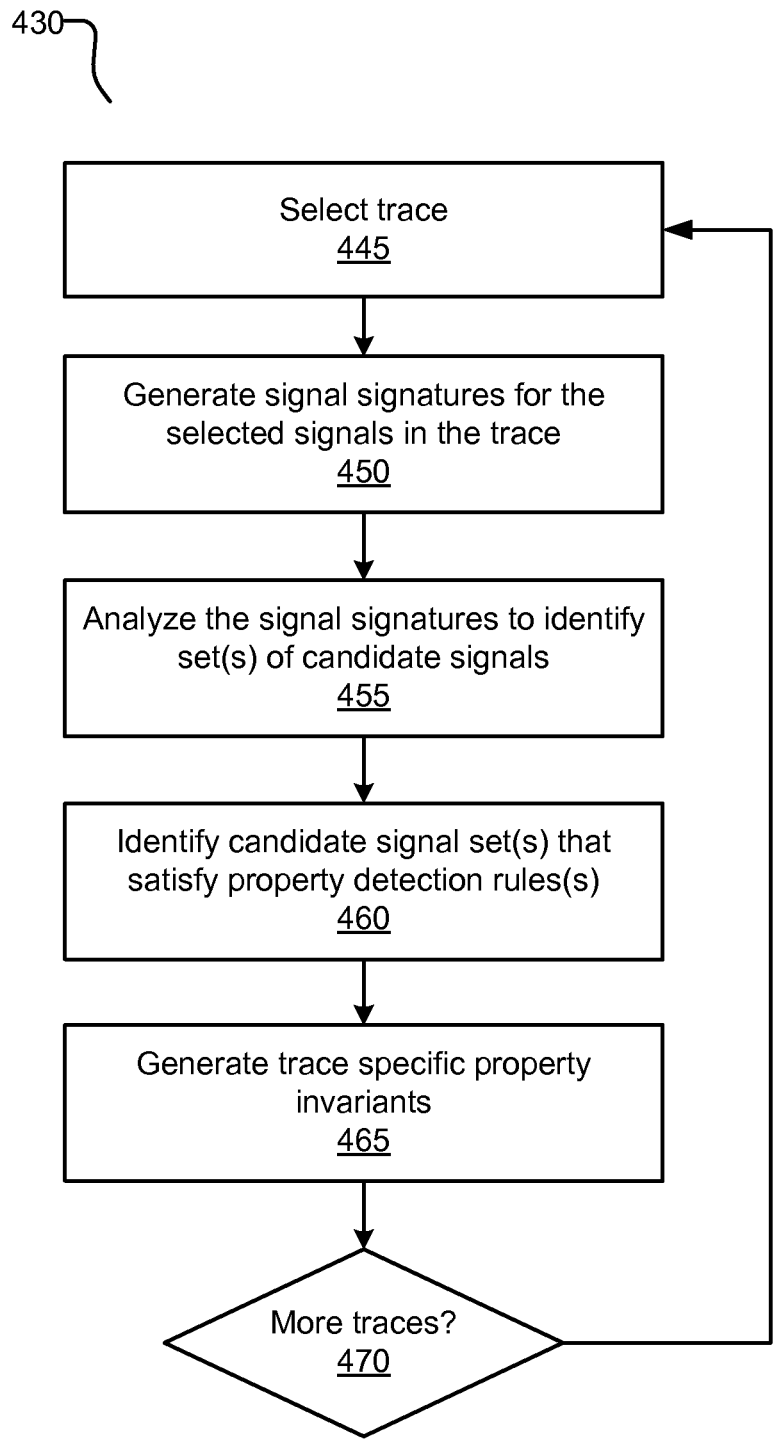
FIG. 4B is an expanded view of the step for generating trace specific propertie invariants from FIG. 4A, in accordance with an embodiment.

FIG. 4B is an expanded view of the step 430 for generating trace specific property invariants from FIG. 4A, in accordance with an embodiment. As shown, the step 430 for generating trace specific property invariants for the selected signals can be divided into additional sub-steps, such as steps 445-470. At this point in the process, one or more signal traces have been received and several signals have been selected as corresponding to a POI of the circuit design. In step 445, one of the traces is selected for analysis. Traces are analyzed one at a time to generate trace specific property invariants for each of the traces.

In step 450, signal signatures are generated for the selected signals of the POI. Each signal signature is a concise representation of the characteristics of a single signal as determined from the signal's values in the trace. Continuing with the example from FIG. 3A, one signal signature can be generated for the read_req signal. Another signal signature can be generated for the read_ack signal. Another signal signature can be generated for the extra signal. The signal signatures are generated over a trace segment of any length such that each signal signature is representative of all the signal values for a given signal within that trace segment. In some embodiments, the trace segment may include all of or less than all of the clock cycles in a trace.

Examples of signal characteristics that can be used to generate the signal signature include: zero cycle count, value count, or continuous cycle count. In other embodiments, the signal characteristics can include any other characteristics that can be extracted from the signal values and concisely represented in a signal signature.

The zero cycle count refers to the number of clock cycles during which a signal is logic low, i.e. has a logic level of "0". Continuing with the example from FIG. 3A, read_req in trace 305 has a zero cycle count of "6" because it has a logic level of "0" during six clock cycles: 2, 3, 6, 7, 8, and 13. Clock cycle 1 is ignored because rst is de-asserted during the first clock cycle. Similarly, signal read_ack has a zero cycle count of "10" because it has a logic level of "0" during ten clock cycles: 2, 3, 4, 6, 7, 8, 9, 10, 11 and 13. Clock cycle 1 is ignored because rst is de-asserted during the first clock cycle. In some embodiments, a one cycle count may be used instead of the zero cycle count. The one cycle count refers to the number of clock cycles during which a signal is logic high.

The value count represents how often the signal switches signal values and be determined from an indication of how frequently the signal switches values. In one embodiment, value count can be determined by counting the number of continuous periods of time during which the signal stays at a particular logic level. Continuing with the example from FIG. 3A, read_req in trace 305 has a value count of "5" because it takes on a total of five signal values by switching from 0→1→0→1→0 during cycles 2-13. Clock cycle 1 is ignored because rst is de-asserted during the first clock cycle.

Continuous cycle count refers to the number of continuous cycles that a signal stays at one signal value before switching to a different signal value. In one embodiment, the continuous cycle count can be input into a hash function to compute a hash value of the continuous cycle count. The hash value for a signal will be relatively unique to the signal, although it may be possible that some signals will share the same hash value. Continuing with the example from FIG. 3A, read_req starts at logic zero for 2 cycles, switches to logic one for 2 cycles, switches to logic zero for 3 cycles, switches to logic one for 4 cycles, and switches to logic zero for the last cycle. The numbers 2, 2, 3, 4 and 1 would thus be the continuous cycle count that is input to a hash function to compute the hash value for read_req. Any of a number of different hash functions can be used to compute the hash value. In other embodiments, the hash value can be computed from other characteristics of the signal values other than the continuous cycle count.

The following table illustrates some of the information that may be included in the signal signatures for the read_req and read_ack signal in trace 305. Signal signatures may not be generated for clk and rst because these signals are pre-determined to be irrelevant to generating properties.

| Signal | Zero Cycle Count | Value Count | Hash of continuous cycle count |
|---|---|---|---|
| read_req | 6 | 5 | 77847 |
| read_ack | 10 | 5 | 90719 |
| extra_1 | 11 | 3 | 120565 |
| extra_2 | 6 | 5 | 77874 |

In step 455, the property generation tool analyzes the signal signatures to identify sets of candidate signals for further analysis. Each set of candidate signals can include two or more signals that are candidates for the application of more computationally intensive property detection rules. In one embodiment, the property generation tool applies candidate detection rules to the signal signatures that are designed to filter out irrelevant signals while also identifying sets of signals that are candidates. The candidate detection rules for a given property may be specific to the type of property that is being generated. For example, when generating a handshake property, the tool may apply one or more of the following candidate detection rules:

(1) The value count of a signal's signature is compared to a threshold value, and if the value count is less than the threshold, the signal is eliminated from consideration. Having a value count that is less than a threshold indicates that the signal is relatively constant and is unlikely to be useful in generating properties. In some embodiments, the threshold is set to "1" so that only signals with completely constant values are filtered out.

(2) A signal's hash value is compared to the hash value of other signals. If two signals have the same hash value, this indicates that the two signals could be, but are not necessarily, duplicates or logical complements of each other. For signals that have the same hash value, the property generation tool analyzes the signal values of these signals to determine if the signals are in fact duplicates or logical compliments. If two signals are duplicates or logical complements, one of the signals is eliminated from consideration while the other signal is retained. The selection of which signal to retain can be arbitrary.

(3) The zero cycle count of two signals can be used to determine the active cycle count of the two signals. Signals are typically active low or active high, and active cycle count refers to the number of cycles during which a signal is asserted. The active cycle count of the first signal is compared to the active cycle count of the second signal. If the active cycle count of the first signal (i.e. a signal assumed to correspond to REQ) is greater than the active cycle count of the second signal (i.e. a signal assumed to correspond to ACK), the signals are a potential REQ-ACK pair and identified as a set of candidate signals. This is because, when two signals follow a handshaking protocol, the REQ signal is active more often than the ACK signal.

In one embodiment, identifying sets of candidate signals can be divided into two substeps. First, individual signals may be filtered out and eliminated from consideration if they do not satisfy one or more candidate detection rules. Continuing with the example from FIG. 3A. signals read_req and extra_2 are inverted from each other and have the same hash value. By applying rule (2) to the hash values of read_req and extra_2, it is identified that these two signals are logical complements of each other. Signal extra_2 is thus eliminated from consideration while signal read_req is retained.

Second, signals that remain are evaluated against additional candidate detection rules to form sets of candidate signals. Continuing with the example from FIG. 3A, after rule (2) is applied, the remaining signals are now read_req, read_ack, and extra_1. These remaining signals are grouped into pairs of signals and rule (3) is applied to the zero cycle counts of the signals in each pair. Because read_req is active for more cycles than read_ack and extra_1, the application of rule (3) results in both {read_req, read_ack}, {read_req, extra_1} being identified as sets of candidate signals. Because read_ack is active for more cycles than extra_1, {read_ack, extra_1} is also identified as a set of candidate signals.

For POIs that are associated with a large number of signals, the process of generating properties can be computationally intensive if the signal values for each of the signals are to be analyzed in detail. By leveraging the signal signatures to identify sets of candidates for further analysis, signals that are irrelevant to generating a property are effectively filtered out while keeping the signals that are potentially relevant. The more computationally intensive operations of the next step 460 are then performed only on the sets of candidate signals.

In step 460, the property generation tool then identifies, from the candidate signal sets, one or more sets of the candidate signals sets that satisfy one or more property detection rules. The property detection rules for a given property invariant may be specific to the type of property that the invariant represents, and the rules may describe a relationship between two or more signals of the circuit design. To determine if candidate signal sets satisfy the property detection rules, the tool performs the computationally intensive task of analyzing the signal trace and comparing the signal values of the candidate signals to each other. Property invariants are generated for the candidate signal sets that satisfy the property detection rules. For sets of candidate signals that do not satisfy the rules, it is determined that these candidate signal sets are not relevant and thus property invariants are not generated for these sets of candidate signals.

The property detection rules may differ depending on the type of property invariant that is being generated. In one embodiment when generating a handshake property invariant for a handshaking protocol, the property generation tool first determines if the relationship between the candidate signals satisfies the rule "ACK|→REQ", which means that whenever a signal that is assumed to be ACK is asserted, a signal that is assumed to be REQ is also asserted in the same clock cycle. The property generation tool then applies the following rules: (1) REQ stays asserted until ACK becomes asserted (2) when REQ and ACK are asserted, they de-assert at the same time (3) every ACK assertion is associated with a unique REQ assertion (4) ACK can only stay asserted for one clock cycle (5) the last REQ assertion can be without an ACK assertion.

Continuing with the example from FIG. 3A, {read_req, read_ack}, {read_req, extra_1}, and {read_ack, extra_1} have been identified as sets of candidate signals. For signal pair {read_req, read_ack}, the signal values for read_req and read_ack are checked to determine if they comply with the rule "read_ack|→read_req". Because read_ack is asserted during cycles 5 and 12 and read_req is also asserted during these cycles, the first rule is met. Signals read_req and read_ack are then checked against the five additional property detection rules. Because these two signals do satisfy the additional property detection rules, {read_req, read_ack} is identified as a set of candidate signals that a handshake property invariant will be generated for.

For signal pair {read_req, extra_1}, extra_1 is asserted during cycle 8 but read_req is not asserted during cycle 8. Similarly, for signal pair {read_ack, extra_1}, extra_1 is asserted during cycle 8 but read_req is not asserted during cycle 8. Thus, neither of these two sets of candidate signals satisfy the property detection rule of "ACK|→REQ" and handshake property invariants will not be generated for these sets of candidate signals.

In other embodiments, handshaking protocols have different sub-types that behave differently from the other handshaking sub-types. Each sub-type of the handshaking protocol may be associated with its own set of candidate detection rules or property detection rules.

As another example, the property generation tool may apply a set of property detection rules designed to identify a one-hot property invariant. A one hot-property specifies that, for a group of signals, the only legal combination of values are those where a single signal is high and all others are low. In one embodiment, the rules for identifying a one-hot property invariant are that (1) there is a vector of signals that includes at least three signals, and (2) at each cycle only one signal in the vector has the value of "1."

In step 465, one or more trace specific property invariants are generated from the subset of candidate signals that satisfy the property detection rules. Property invariants can be generated in any form that is appropriate for representing the relationship between two or more signals. In one embodiment, a property invariant is simply generated by associating a type of the property that was detected (e.g., handshake property, one-hot property) with the candidate signals that satisfied the detection rules for the property. Alternatively, some textual representation of the property invariant that includes this information can be generated.

Some property invariants may have parameters that describe an attribute of the property invariant. In one embodiment, for property invariants that have parameters, values for the parameters are also determined by analyzing the signal values of the signals associated with the property invariant. Continuing with the example from FIG. 3A, the property invariant generated for trace 305 may be "$handshake (read_req, read_ack, 1, 3, 1, 0, 0)." The first parameter ("1") is the minimum delay between when read_req is asserted and when read_ack is asserted. The second parameter ("3") is the maximum delay between when read_req is asserted and when read_ack is asserted. The third parameter ("1") is the handshake protocol sub-type that was detected. The fourth parameter ("0") is the de-assertion count, which is the number of cycles that read_req stays asserted after read_ack is de-asserted. The fifth parameter ("0") is the maximum number of back-to-back transactions.

In step 470, the tool determines if more traces are available for analysis. If so, steps 445 through 465 are repeated for the additional traces to determine additional trace specific property invariants. For example, steps 445 through 465 can be repeated for trace 310 from FIG. 3B to determine a trace specific property invariant for trace 310. The trace specific property invariant determined by analyzing trace 310 may be "$handshake(read_req, read_ack, 1, 5, 1, 0, 0)." The handshake property invariant for trace 310 differs from the handshake property invariant for trace 305 in that the maximum request-to-ack delay is now "5" instead of "3".

Referring back to FIG. 4A, in one embodiment the trace specific invariant may be directly used to generate 442 a property. For example, the property generated for trace 305 may be "assert $handshake(read_req, read_ack, 1, 3, 1, 0, 0)" which is a assertion property that asserts that read_req and read_ack should always follow a specified handshaking behavior. As another example, the property generated for trace 315 may be "assert $handshake(read_req, read_ack, 1, 5, 1, 0, 0)" which is a assertion property that asserts that read_req and read_ack should always follow a specified handshaking behavior. In another embodiment, the trace specific invariants are instead generalized 435 into generalized property invariants, which are explained by reference to FIG. 4C.

Generalized Property Invariants

Figure 4C:
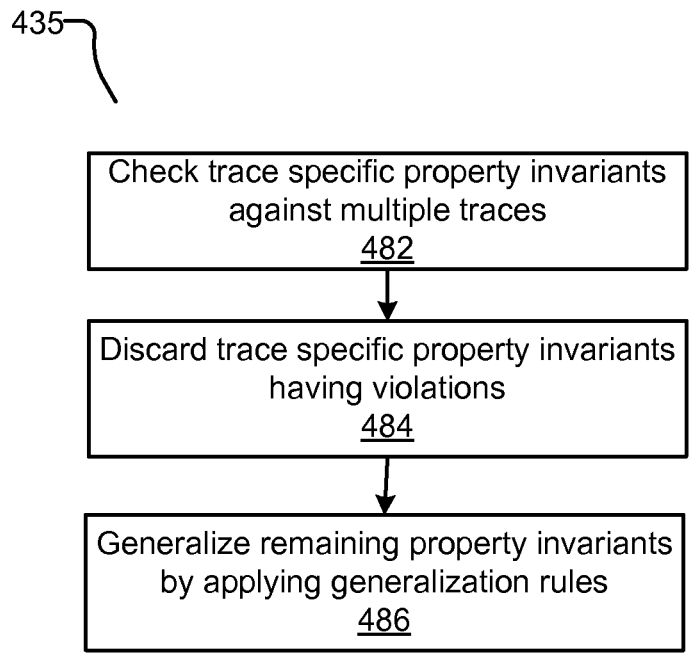
FIG. 4C is an expanded view of the step for generalizing trace specific property invariants into generalized property invariants, in accordance with an embodiment.

FIG. 4C is an expanded view of the step 435 for generalizing trace specific property invariants into generalized property invariants, in accordance with an embodiment. At this point in the process, the tool has generated trace specific property invariants for multiple traces. The trace-specific property invariants represent the behavior of a single trace, but may not represent the behavior of the circuit design across all traces. Thus, in step 482, each trace specific property invariant is checked against the other traces to identify violations of the trace specific property invariants. A violation exists if the invariant does not hold true in the other traces. In step 484, if a violation exists, the property invariant is discarded. On the other hand, if a violation does not exist, the property invariant is kept and passed on to step 486.

In step 486, the remaining trace specific property invariants are generalized into a more abstract version of the property invariants. Property invariants can be generalized when they describe the behavior of the same set of signals and the property invariants are of the same property type (e.g., handshake properties). Specifically, property invariants are generalized by applying a set of generalization rules that are associated with the property type. For handshake properties, the generalization rules may specify that the minimum REQ-to-ACK delay parameter is set to the minimum value from the property invariants being generalized. The maximum REQ-to-ACK delay parameter is set to the maximum value from the property invariants being generalized. Continuing with the example from FIGS. 3A and 3B, suppose the trace specific property invariants $handshake(read_req, read_ack, 1, 3, 1, 0, 0) and $handshake(read_req, read_ack, 1, 5, 1, 0, 0) are being generalized. The first invariant has a max REQ-to-ACK delay of 3 and the second invariant has a max REQ-to-ACK delay of 5. The resulting generalized property would be $handshake (read_req, read_ack, 1, 5, 1, 0, 0) because the larger max REQ-to-ACK delay of "5" is used as the maximum delay in the generalized property invariant according to the generalization rules.

Referring back to FIG. 4A, in one embodiment the generalized invariant may be directly used to generate 442 a property. For example, the property generated for traces 305 and 310 may be "assert $handshake(read_req, read_ack, 1, 5, 1, 0, 0)" which is a assertion property that asserts that read_req and read_ack should always follow a specified handshaking behavior. In another embodiment, the generalized invariants are instead used to generate compound invariants, which are explained by reference to FIG. 4D.

Compound Property Invariants

Figure 4D:
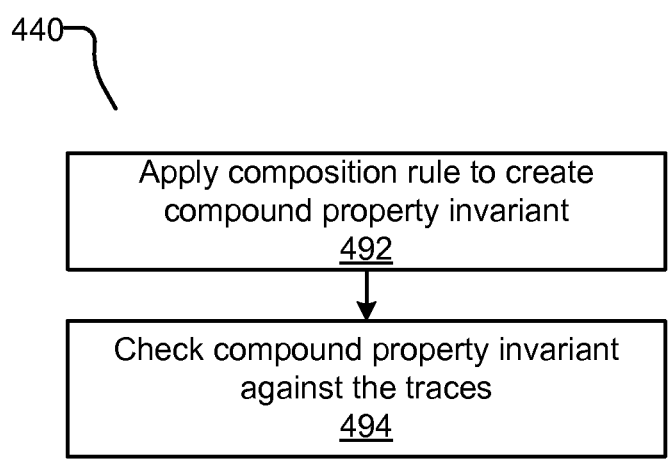
FIG. 4D is an expanded view of the step for combining compound property invariants into compound invariants, in accordance with an embodiment.

FIG. 4D is an expanded view of the step 440 for combining compound property invariants into compound invariants, in accordance with an embodiment. Compound property invariants represent a combination of simple property invariants (e.g., global invariants or trace specific invariants). The simple property invariants used to compose a compound property invariant may each have at least one signal that is different than the other simple property invariants, and the resulting compound property represents a relationship between all of the signals from all of the simple invariants. For example, the simple property invariants used to compose a compound invariant may be $mutex(a, b), $mutex(a,c) and $mutex(b,c). The mutex invariant indicates that two or more signals of the invariant are mutually exclusive, i.e. only one of the signals can be asserted at any given time. These invariants can be combined to create the compound property invariant of $mutex(a,b,c), which indicates that a, b and c are mutually exclusive such that only one of a, b and c is asserted at any given time.

To combine the simple invariants into the compound property invariant, in step 492, a composition rule is applied to the simple properties to create a compound property invariant. The precise composition rules applied depend on the type of compound property being generated. Specifically, to generate a fairness property invariant, the composition rules for the fairness property invariant require several handshake property invariants and a one-hot property invariant as inputs. The handshake property invariants and one-hot property invariants should be of the form:

$handshake(a0, b[0], . . . )
$handshake(a1, b[1], . . . )
$handshake(aN, b[N] . . . )
$onehot0(b[N:0])

where a0, a1, and aN are individual signals representing requests to a resource and b is a group of signals N:0 representing acknowledgements of those requests. $onehot(b[N: 0]) specifies that one and only one signal in b[N:0] can be asserted at any given time. The composition rules then combine these simple properties into the compound property of:

$fairness (a0, a1, . . . , aN, b[N:0])

In other words, the handshake property invariants are used to recognize multiple requestors requesting access to a shared resource. The one-hot property invariant is used to recognize that only one request can be granted at any given time. The property invariants can then be combined to synthesize a fairness property that describes arbitration to the shared resource.

In step 494, the compound property invariant is verified against each of the traces to ensure that it is true. This step is a safety check to prevent un-true properties from being output to the user.

Referring back to FIG. 4A, in one embodiment the compound property invariant is used to generate 442 a property. For example, a fairness property generated by the property generation tool may take the form "assert $fairness (a0, a1, ..., aN, b[N:0])" which is an assertion property that asserts that signal vectors a and b should follow a particular arbitration policy so that no requestor is starved of access to a shared resource.

The property generation tool disclosed herein thus allows for automatic generation of properties for a circuit design from one or more signal traces of the circuit design. By generating signal signatures, irrelevant signals can be filtered out so that the time needed for property generation is greatly reduced. The output of the tool includes properties, such as handshake properties and fairness properties, as well as other types of properties, that can be used to further verify the operation of the circuit design and eliminates the need for a circuit designer to write the properties by hand.

Additional Considerations

The foregoing description of the disclosed embodiments has been presented for the purpose of illustration; it is not intended to be exhaustive or to limit the disclosed embodiments to the precise forms disclosed. Persons skilled in the relevant art can appreciate that many modifications and variations are possible in light of the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the present disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the present disclosure be limited not by this detailed description, but rather by any claims that issue on an application based hereon. Accordingly, the description of the disclosed embodiments is intended to be illustrative, but not limiting, of the scope of the present disclosure, which is set forth in the following claims.

What is claimed is:

1. A computer program product for generating circuit design properties, the computer program product comprising a non transitory computer-readable storage medium containing computer program code for:
   receiving a trace of a circuit design that includes signal values for a plurality of signals of the circuit design over a plurality of clock cycles;
   generating signal signatures based on one or more characteristics of the signal values, each signal signature generated for a different signal of the plurality of signals;
   identifying sets of candidate signals from the plurality of signals based on the signal signatures;
   generating one or more circuit design properties based on the signal values associated with the sets of candidate signals; and
   outputting the one or more circuit design properties.

2. The computer program product of claim 1, wherein identifying the sets of candidate signals based on the signal signatures comprises applying one or more candidate detection rules to the signal signatures to identify the sets of candidate signals.

3. The computer program product of claim 1, wherein generating one or more circuit design properties comprises:
   applying one or more property detection rules to the signal values associated with the sets of candidate signals;
   identifying at least one set of candidate signals from the sets of candidate signals that satisfies the property detection rules; and
   generating the one or more circuit design properties based on the at least one set of candidate signals that satisfies the property detection rules.

4. The computer program product of claim 1, further comprising code for:
   receiving a description of the circuit design; and
   selecting a plurality of signals of the circuit design that correspond to a point of interest in the circuit design,
   wherein the signal values are signal values for the selected signals of the circuit design that correspond to the point of interest.

5. The computer program product of claim 1, wherein generating the signal signatures comprises, for each signal:
   counting a number of cycles during which the signal values of the signal have a same logic value; and
   generating a signal signature for the signal based on the number of cycles during which the signal values have the same logic value.

6. The computer program product of claim 1, wherein generating the signal signatures comprises, for each signal:
   determining an indication of a frequency with which the signal changes signal values; and
   generating a signal signature for the signal based on the indication of the frequency with which the signal changes signal values.

7. The computer program product of claim 1, wherein generating the signal signatures comprises, for each signal, generating a hash of the signal from one or more characteristics of the signal values for the signal using a hash function.

8. The computer program product of claim 1, wherein generating one or more circuit design properties comprises:

identifying a first property invariant of the circuit design based on the signal values associated with the sets of candidate signals sets;

receiving an additional trace of the circuit design that includes additional signal values for the circuit design signals;

identifying a second property invariant of the circuit design from the additional signal values, the second property invariant associated with a same set of signals as the first property invariant; and generalizing the first property invariant and second property invariant into a generalized property invariant of the circuit design; and generating a circuit design property from the generalized property invariant.

9. The computer program product of claim 1, wherein generating one or more circuit design properties comprises:

identifying a first property invariant of the circuit design based on the signal values associated with the sets of candidate signals, the first property invariant associated with a first plurality of the circuit design signals;

identifying a second property invariant of the circuit design, the second property invariant associated with a second plurality of the circuit design signals, the first and second plurality of signals differing by at least one signal;

combining the first property invariant with the second property invariant to generate a compound property invariant of the circuit design; and generating a circuit design property based on the compound property invariant.

10. The computer program product of claim 1, wherein at least one of the properties describes a relationship between two or more signals of the circuit design.

11. The computer program product of claim 1, wherein at least one of the properties describes a relationship between three or more signals of the circuit design.

12. The computer program product of claim 1, wherein at least one of the properties is a handshake property describing a handshaking protocol.

13. The computer program product of claim 1, wherein at least one of the properties is a fairness property describing arbitration among a plurality of requestors to a shared resource.

14. The computer program product of claim 1, wherein the properties comprise at least one of an assertion, a cover, or an assumption.

15. The computer program product of claim 1, wherein outputting the circuit design properties comprises outputting the circuit design properties for display.

16. The computer program product of claim 1, wherein outputting the circuit design properties comprises storing the circuit design properties to a computer memory.

17. The computer program product of claim 1, further comprising code for formally verifying the circuit design against the one or more properties.

18. A method for generating circuit design properties, comprising:

receiving a trace of a circuit design that includes signal values for a plurality of signals of the circuit design over a plurality of clock cycles;

generating signal signatures based on one or more characteristics of the signal values, each signal signature generated for a different signal of the plurality of signals;

identifying sets of candidate signals from the plurality of signals based on the signal signatures;

generating, by a computer, one or more circuit design properties based on the signal values associated with the sets of candidate signals; and outputting the one or more circuit design properties.

19. The method of claim 18, wherein identifying the sets of candidate signals based on the signal signatures comprises applying one or more candidate detection rules to the signal signatures to identify the sets of candidate signals.

20. The method of claim 18, wherein generating one or more circuit design properties comprises:

applying one or more property detection rules to the signal values associated with the sets of candidate signals;

identifying at least one set of candidate signals from the sets of candidate signals that satisfies the property detection rules; and generating the one or more circuit design properties based on the at least one set of candidate signals that satisfies the property detection rules.

* * * * *